US007284178B2

(12) United States Patent
Belzile et al.

(10) Patent No.: US 7,284,178 B2
(45) Date of Patent: Oct. 16, 2007

(54) METHOD AND APPARATUS FOR TESTING A DEVICE IN AN ELECTRONIC COMPONENT (75) Inventors: Jean Belzile, Lachine (CA); Claude Thibeault, Brossard (CA); François Gagnon, Lachine (CA); Naim Batani, Dollard des Ormeaux (CA)

(73) Assignee: Socovar S.E.C., Montreal (CA)

( * ) Notice: Subject to any disclaimer, the term of this patent is extended or adjusted under 35 U.S.C. 154(b) by 374 days.

(21) Appl. No.: 10/421,771

(22) Filed: Apr. 24, 2003

(65) Prior Publication Data

US 2004/0093544 A1 May 13, 2004

Related U.S. Application Data

(60) Provisional application No. 60/425,721, filed on Nov. 13, 2002.

(30) Foreign Application Priority Data

Nov. 10, 2002 (WO) .................. PCT/IB02/04696

(51) Int. Cl.
*G01R 31/28* (2006.01)

(52) U.S. Cl. ..................................... 714/742
(58) Field of Classification Search ................ 714/724, 714/725, 726, 727, 742
See application file for complete search history.

(56) References Cited

U.S. PATENT DOCUMENTS 6,425,100 B1 * 7/2002 Bhattacharya ............... 714/724

OTHER PUBLICATIONS

Sundararajan et al., "Testing FPGA Devices Using JBITS", 2001 MAPLD International Conference, Laurel, Maryland, Sep. 2001, 8 sheets.

* cited by examiner

*Primary Examiner*—James C. Kerveros
(74) *Attorney, Agent, or Firm*—Fay Kaplun & Marcin, LLP.

(57) ABSTRACT

A method and apparatus is disclosed for testing a reconfigurable logic block. Preferably, this invention is intended to be used with Field Programmable Gate Array. According to the invention, a test bus addressing unit and a test bus activation unit are used to perform a test on a logic block. Upon selection of a corresponding logic block, a test data is outputted on a test bus which enables a testing of the logic function.

27 Claims, 8 Drawing Sheets

METHOD AND APPARATUS FOR TESTING A DEVICE IN AN ELECTRONIC COMPONENT

CROSS-REFERENCE TO RELATED APPLICATIONS

This patent application claims priority of U.S. provisional patent application No. 60/425,721, filed Nov. 13, 2002 and entitled "Method and apparatus for testing a device in an electronic component" and of International patent application No. IB/02/04696 entitled "Method and apparatus for testing a device in an electronic component" and filed Nov. 10, 2002.

TECHNICAL FIELD

This invention pertains to the field of electronics; more precisely, this invention relates to the field of testing processing blocks.

BACKGROUND OF THE INVENTION

Integrated circuits may be defined as three different classes.

A first class of integrated circuits comprises analog circuits, while a second class of integrated circuits comprises digital circuits and a third class of integrated circuit comprises mixed circuits.

Analog circuits are circuits which comprise inputs, outputs and processing that are strictly of the analog type. An operational amplifier belongs to this first class of integrated circuits.

Digital circuits are circuits whose inputs, outputs and processing are strictly of the digital type. For instance, Random Access Memory (RAM) and microprocessors belong to this second class of integrated circuits.

Mixed circuits comprise both analog and digital inputs and outputs with usually digital processing. For instance, analog to digital converter and fiber optics transceiver belong to this third class.

Recent observations indicate that in all the above-mentioned classes, current integration trends see a doubling of the number of elements in a circuit every two year.

On the other hand, the number of inputs and outputs in a circuit doubles every five years.

As a consequence, this leads to an increasingly greater number of internal nodes and complex circuitry with little or no access to the input/output ports.

It will therefore be appreciated by someone skilled in the art that such a situation increases tasks related to the debugging of a circuit comprising these internal nodes and complex circuitry.

While someone skilled in the art will appreciate that this is especially true in the domain of reconfigurable devices such as Field Programmable Gate Array (FPGA), it will also be appreciated that such limitations are also met in other types of electronic components implementing a processing function such as non-logic circuits. In any cases, it is highly desirable to be able to isolate and test every resources of a processing block in an electronic component.

Common methods used to isolate and test every resource of the FPGA rely on traditional FPGA design tools and often necessitate a reprogramming of the FPGA in order to implement a chosen testing function. In some cases, reprogramming of the FPGA can take a large amount of time.

Some tools have been recently developed by FPGA manufacturers to provide a probe at a selected point of the FPGA to provide its value to an output of the FPGA by appropriate FPGA programming. Someone skilled in the art will appreciate that while such a feature may help a designer to locate potential errors, it does not provide an efficient toolkit to test every resources of the FPGA.

In fact, as the number of outputs of the FPGA is limited, the potential number of probe points is also limited.

There is therefore a need to overcome the above-mentioned drawbacks.

SUMMARY OF THE INVENTION

It is an object of the invention to provide an apparatus for testing a plurality of devices in a field programmable gate array.

Yet another object of the invention is to provide an apparatus for testing a plurality of devices in an electronic component.

It is another object of the invention to provide a method for testing a plurality of devices in an electronic component.

Yet another object of the invention is to provide a method for testing a plurality of devices in a field programmable gate array.

According to one aspect of the invention, there is provided a method for testing a plurality of devices in an electronic component, the method comprising the steps of receiving a plurality of data signals from a plurality of devices to test, each of the plurality of devices to test receiving an input signal and providing a data signal in accordance with a device function, selecting at least one of the received plurality of data signals in accordance with a device selection signal, and providing the selected data signals on a test bus, whereby the selection of at least one of the received plurality of data signals on a test bus enables a testing of a plurality of devices.

According to another aspect of the invention, there is provided an apparatus for testing at least one device in an electronic component, each of the at least one device of the electronic component receiving an input signal and providing an output signal in accordance with a device function, the electronic component comprising a plurality of devices, the apparatus comprising a data signal selecting unit, receiving a data signal outputted from a device in response to an input signal provided to the device, and providing the data signal in accordance with a selection signal and a test bus, receiving the data signal from the data selecting unit and outputting the data signal on an output of the electronic component.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION OF THE PREFERRED EMBODIMENT

Figure 1:
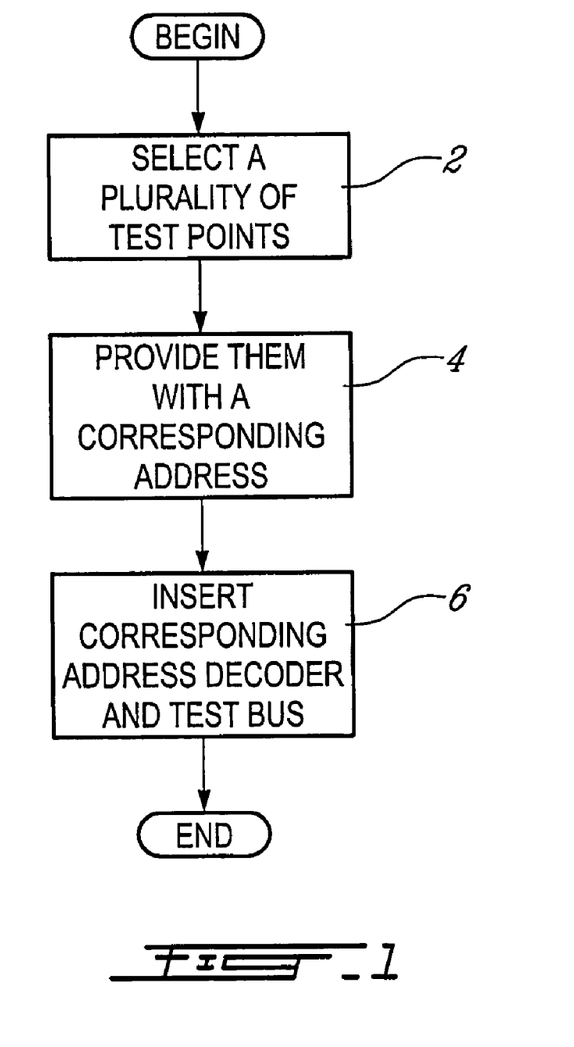
FIG. 1 is a flow chart which shows the preferred embodiment of the invention; a plurality of test points are selected in a design to test; a corresponding address is then attributed to each of the selected test points and a corresponding address decoder and a test bus activation unit are inserted for each of the selected test points.

Now referring to FIG. 1, there is shown the preferred embodiment of the invention.

According to step 2, a plurality of test points are selected in an electronic component. In one embodiment of the invention, each of the selected plurality of test points is preferably located at an output of a processing block to test; in the preferred embodiment, the plurality of test points are located inside the processing block to test, in order to probe an internal element of the processing block. The processing block is implementing a processing function. These test points are selected in accordance with a user choice.

It will be appreciated that the processing block may be located in any one of an analog circuit, a digital circuit and a mixed circuit. In the case of a digital circuit the processing block may be a logic bloc.

According to step 4, and still in the preferred embodiment of the invention, an address, identifying a test point of the plurality of test points, is attached to each of the plurality of selected test points.

The address is preferably a base-2 type address. In another embodiment, any other type of addressing scheme may be used to identify a test point. Still in the preferred embodiment of the invention, the address attached to each of the selected test points is unique.

According to step 6 of FIG. 1, a corresponding address decoder and a test bus activation unit is inserted in the design of the electronic component for each of the selected test points as explained below.

The corresponding address decoder is responsible for providing an activation signal to the test bus activation unit if a test address signal provided to the address decoder refers to the corresponding test address of the decoder.

In the case where the electronic component is a Field Programmable Gate Array (FPGA), the design of the FPGA (i.e. layout) is compiled and a resulting bitstream is provided to the FPGA. It will also be appreciated by someone skilled in the art that the invention may be implemented in the design using a VHDL routine.

Figure 2:
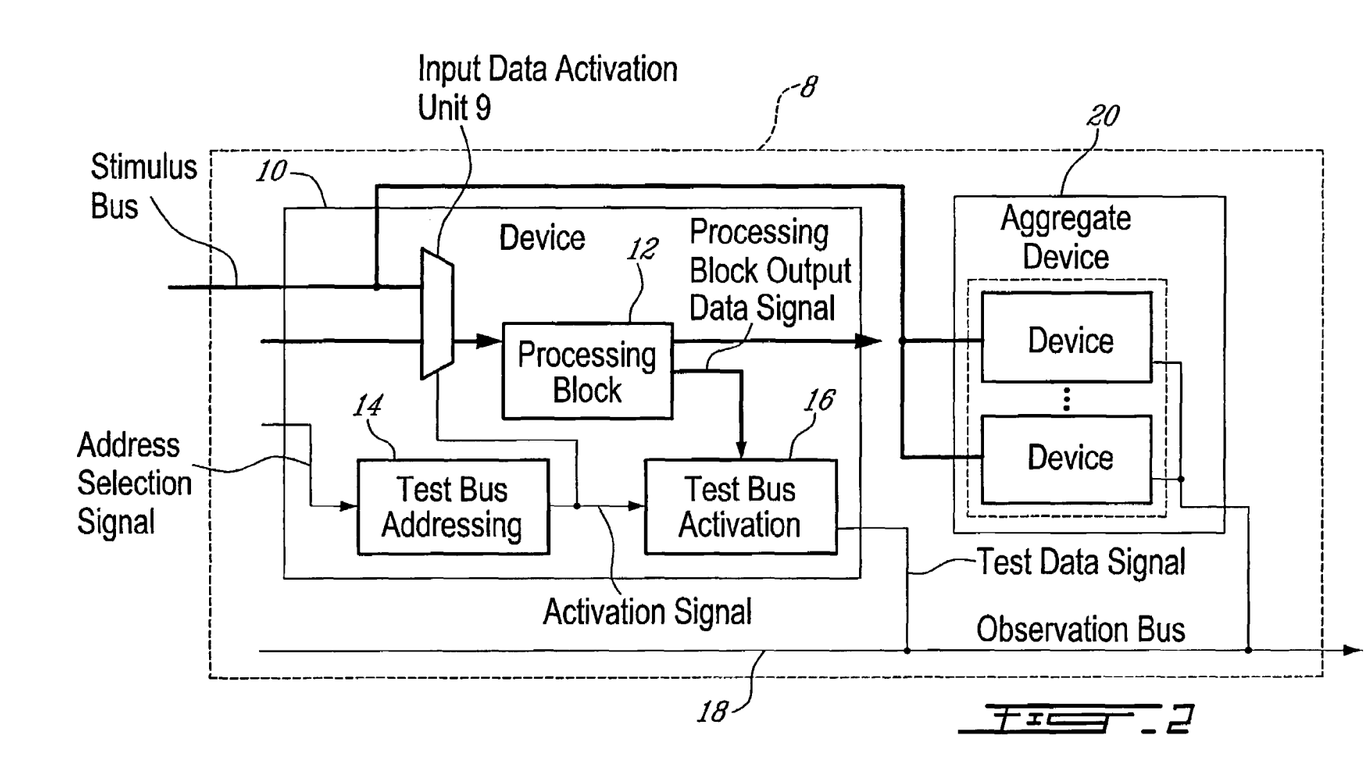
FIG. 2 is a block diagram which shows two embodiments of the invention; in one embodiment, a test bus general structure is provided, in another embodiment, a stimulus bus test is provided.

Now referring to FIG. 2, there is shown two embodiments of the invention. In a first embodiment of the invention, an electronic component 8 comprises a device 10 and an aggregate device 20 comprising a plurality of devices 10.

The device 10 and the aggregate device 20 are connected to a common test bus 18.

The device 10 comprises a processing block 12 to test, a test bus addressing unit 14 and a test bus activation unit 16.

The processing block 12 receives an input signal and provides an output signal in accordance with a processing function.

In the case where the processing function is an FPGA, the processing function may be any one of a logic function that can be implemented in an FPGA.

People skilled in the art will also appreciate that this invention may also be implemented in any reprogrammable devices such as PLD, GAL, etc. In these cases, the invention may be implemented using a corresponding programming language used normally to program the reprogrammable devices.

The test bus addressing unit 14 receives an address selection signal and provides an activation signal to the test bus activation unit 16 if the address selection signal provided to the test bus addressing unit 14 matches the address of the device to test 10. The address selection signal may be provided from either a device of the electronic component 8 or directly from an input pad.

If the test bus activation unit 16 is activated by the activation signal, at least one part of a processing block output data signal outputted by the processing block 12 is outputted on the test bus 18. In the preferred embodiment of the invention and as explained above, at least one of a plurality of signals located in the processing block 12 is outputted on the test bus 18.

In the preferred embodiment of the invention, the test bus activation unit 16 is implemented using a three-state buffer which outputs the test data signal on the test bus 18 if the test bus activation unit 16 is activated by the activation signal. In another embodiment, the test bus activation unit 16 is implemented using a multiplexer.

It will be appreciated by someone skilled in the art that such method and apparatus disclosed do not require multiple recompilings of the whole design.

The test bus activation units 16 as well as the test bus addressing unit 14 are inserted only at one time in the design.

As mentioned previously, the processing block 12 may be located in any one of an analog circuit, a digital circuit and a mixed circuit. In the case of an analog circuit or a mixed circuit, the test bus 18 may be of the analog type. Still in such embodiment, the test bus activation unit 16 may be energized using the activation signal provided by the test bus addressing unit 14. An amplifier may be used to provide a suitable current to the output pad.

Still referring to FIG. 2, there is also shown another embodiment of the invention, in this other embodiment, an input data activation unit 9 is provided together with a stimulus bus. The input data activation unit 9 receives a stimulus signal originating from said stimulus bus. The input data activation unit 9 further receives an input signal for said processing unit 12. The input data activation unit 9 is controlled by the activation signal provided by the test bus addressing 14. Upon activation, the input data activation unit 9 provides the stimulus signal to the processing block 12. The processing block output data signal is outputted as explained above. It will be appreciated by someone skilled in the art that this embodiment enables the providing of a stimulus signal to a processing block when required.

It will be appreciated that the test bus 18 is not mandatory for providing a stimulus signal according to this embodiment.

Figure 3:
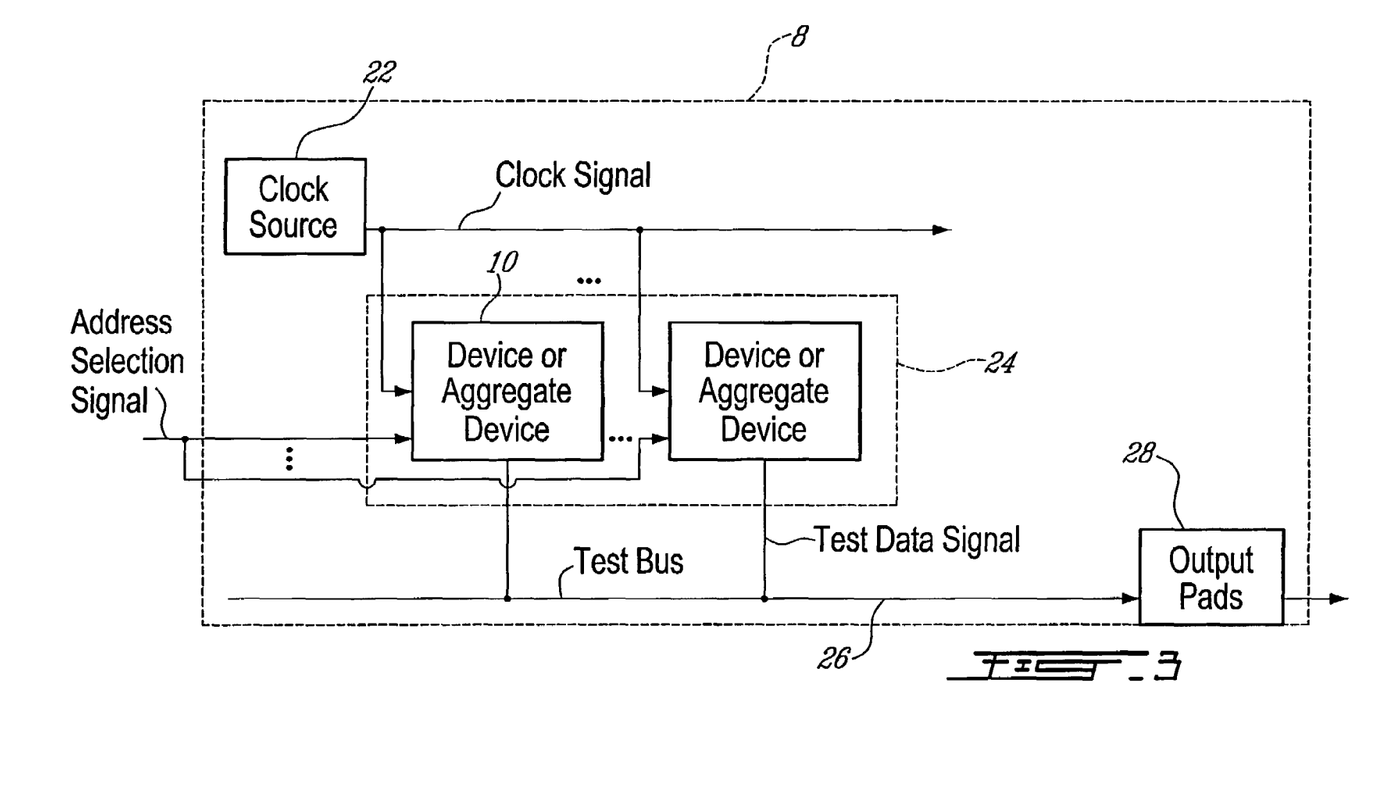
FIG. 3 is a block diagram which shows another embodiment of the invention; in this embodiment, the test bus is unclocked.

Now referring to FIG. 3, there is shown another alternative embodiment of the invention, where test data signals are unclocked.

In this embodiment of the invention, a clock source 22 provides a clock signal to a plurality of devices or aggregate devices 24 to test. The plurality of devices or aggregate devices 24 to test are connected to a test bus 26. The test bus 26 is connected to output pads 28. The output pads 28 are used to output a signal from the electronic component.

It will be appreciated that such unclocked test bus 26 may be used for analog and/or asynchronous circuits. The unclocked test bus 26 may also be used to visualize timing information when multiple clock domains are used.

Preferably, the embodiment shown in FIG. 3 is used when clock period is substantially longer than internal routing delays of the electronic component 8.

Figure 4:
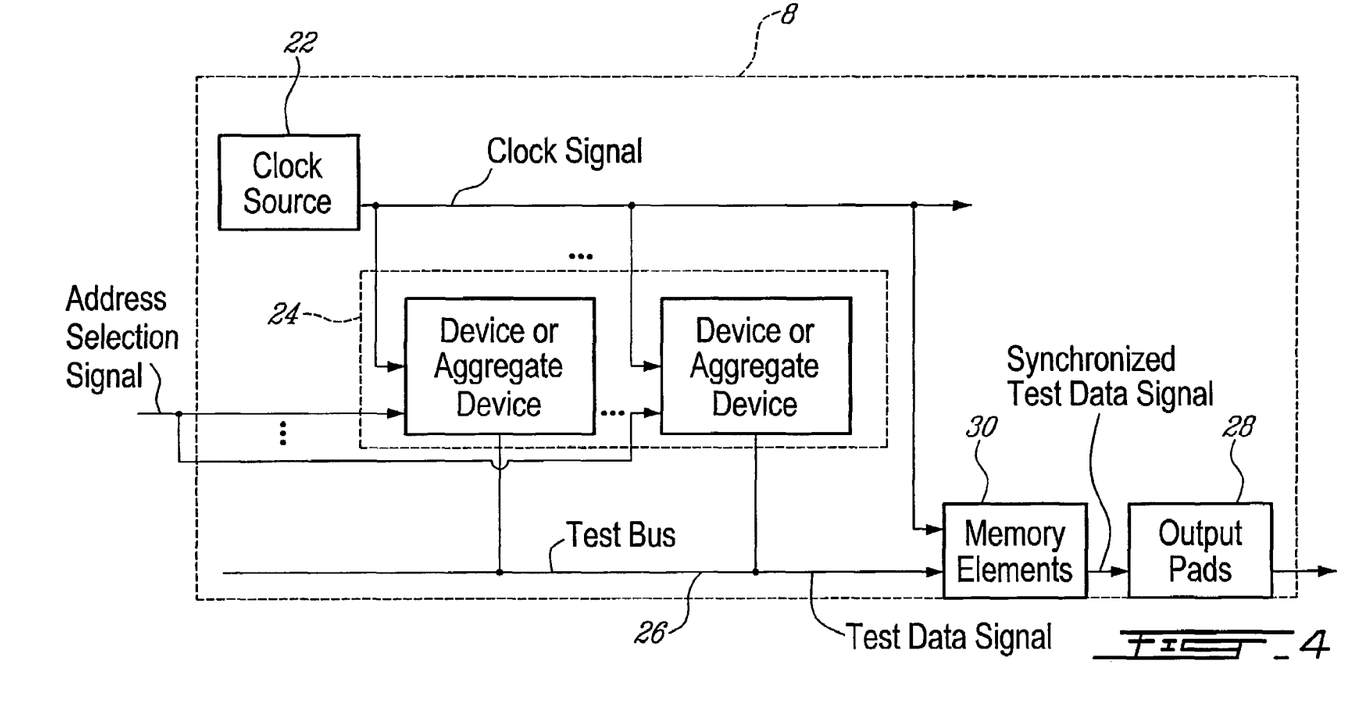
FIG. 4 is a block diagram which shows another embodiment of the invention; in this embodiment, a shared test bus is clocked by a single clock signal.

Now referring to FIG. 4, there is shown another alternative embodiment of the invention.

In this alternative embodiment of the invention, the electronic component 8 comprises a clock source 22, a plurality of devices or aggregate devices 24, a test bus 26, memory elements 30 and output pads 28.

The clock source 22 provides a clock source signal to each of the plurality of devices or aggregate devices to test 24 to test and to the memory elements 30.

Each of the plurality of devices or aggregate devices 24 to test are connected to the test bus 26. Each of the plurality of devices or aggregate devices may be selected using an address selection signal.

The test bus 26 is also connected to the memory elements 30. The memory elements are connected to the output pads 28.

Preferably, the memory elements 30 are connected very close to the output pads 28 in order to limit time delays.

The memory elements 30, clocked using the clock source signal are used to resynchronize test data provided by a device or aggregate device of the plurality of devices or aggregate devices 24 on the test bus 26 with respect to the clock source 22.

Such re-synchronization is performed by the memory elements 30 in order to provide a synchronized test data signal.

The synchronized test data signal is provided to the output pads 28 by the memory elements 30.

Figure 5:
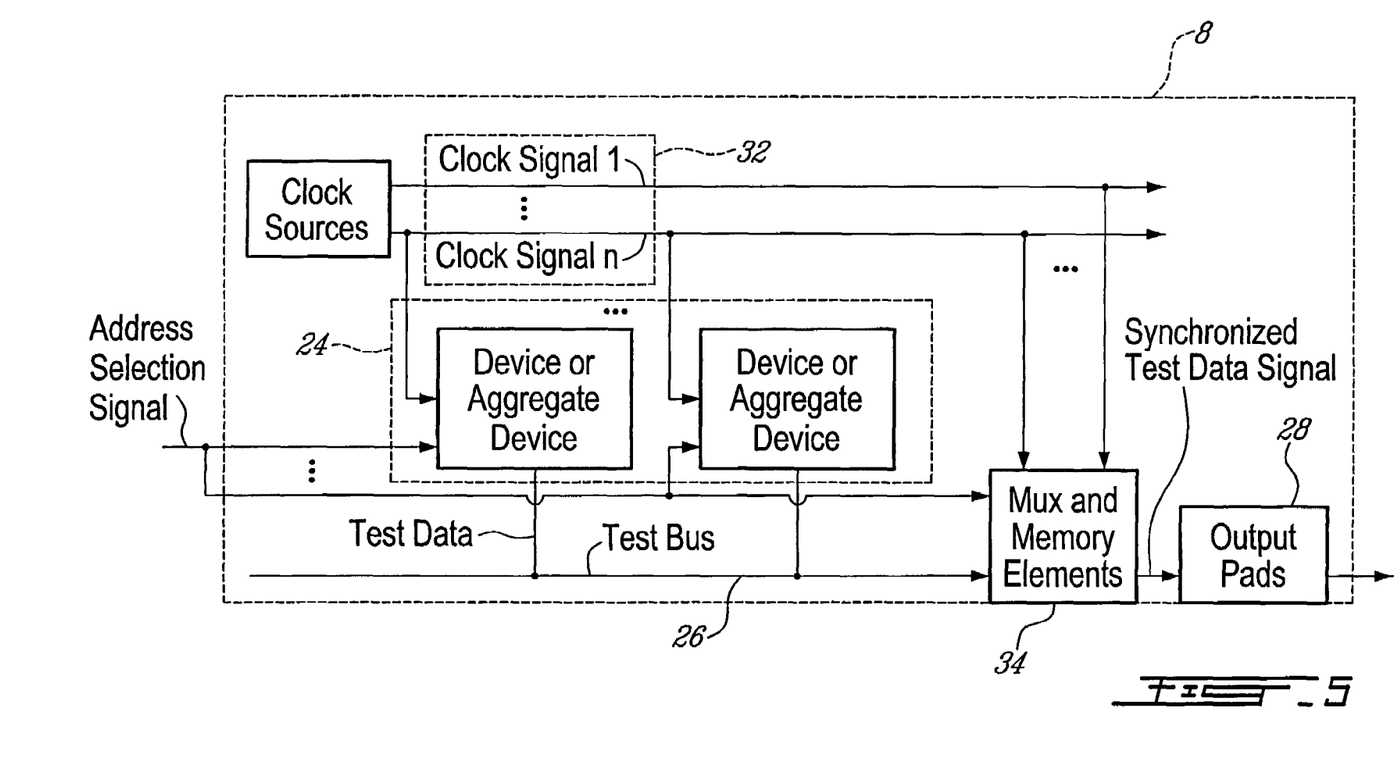
FIG. 5 is a block diagram which shows another embodiment of the invention; in this embodiment, a shared bus is clocked by a plurality of clock signals.

Now referring to FIG. 5, there is shown another alternative embodiment of the invention.

In this alternative embodiment, a plurality of clock signals 32 are generated by a plurality of clock signal sources. Each of the plurality of clock signals 32 is provided to a device or aggregate device of a plurality of devices or aggregate devices 24.

The device or aggregate device is connected to a test bus 26. As shown in FIG. 2, the devices or aggregate devices which may be tested and which are therefore connected to the test bus 26 each comprises the test bus addressing unit 14 and the test bus activation unit 16.

Test data is outputted on the test bus by one selected of the plurality of devices or aggregate devices 24 using an address selection signal.

A multiplexer connected to memory elements 34 is used to select one of the plurality of clock signals 32. The selected one of the plurality of clock signals 32 is selected depending on the address selection signal used to select the device or aggregate device selected to be tested.

This is performed in order to ensure that the test data outputted on the test bus 26 is correctly resynchronized using a correct clock signal. The synchronized test data signal is then provided to the output pads 28.

Figure 6:
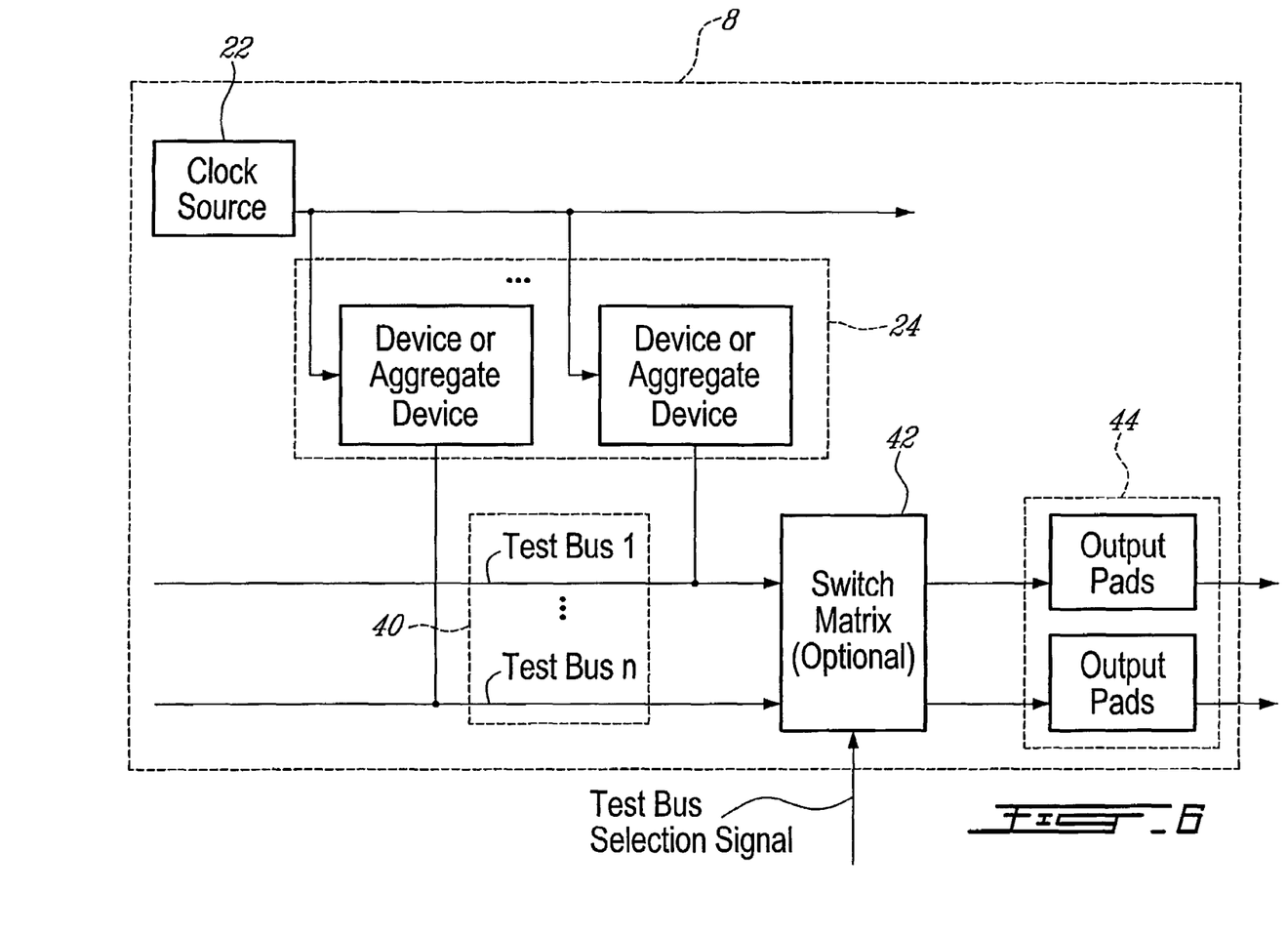
FIG. 6 is a block diagram which shows another embodiment of the invention; in this embodiment, a plurality of test buses are clocked by a plurality of clock signals.

Now referring to FIG. 6, there is shown another alternative embodiment of the invention.

In this alternative embodiment, a plurality of test buses 40 are used.

More precisely at least one of a plurality of devices or aggregate devices 24 is connected to a test bus of the plurality of test buses 40. An optional switch matrix 42 is then used to select at least one of the plurality of test buses using a test bus selection signal.

The selected corresponding test buses provide corresponding test data to at least one of a plurality of output pads 44. It will be appreciated by someone skilled in the art that such embodiment enables a flexible amount of output to be provided. It will be further appreciated that in this embodiment, the test buses 40 are unclocked. It will also be appreciated that each device or aggregate device of the plurality of devices or aggregate devices 24 does not comprise a test bus addressing unit 14.

Figure 7:
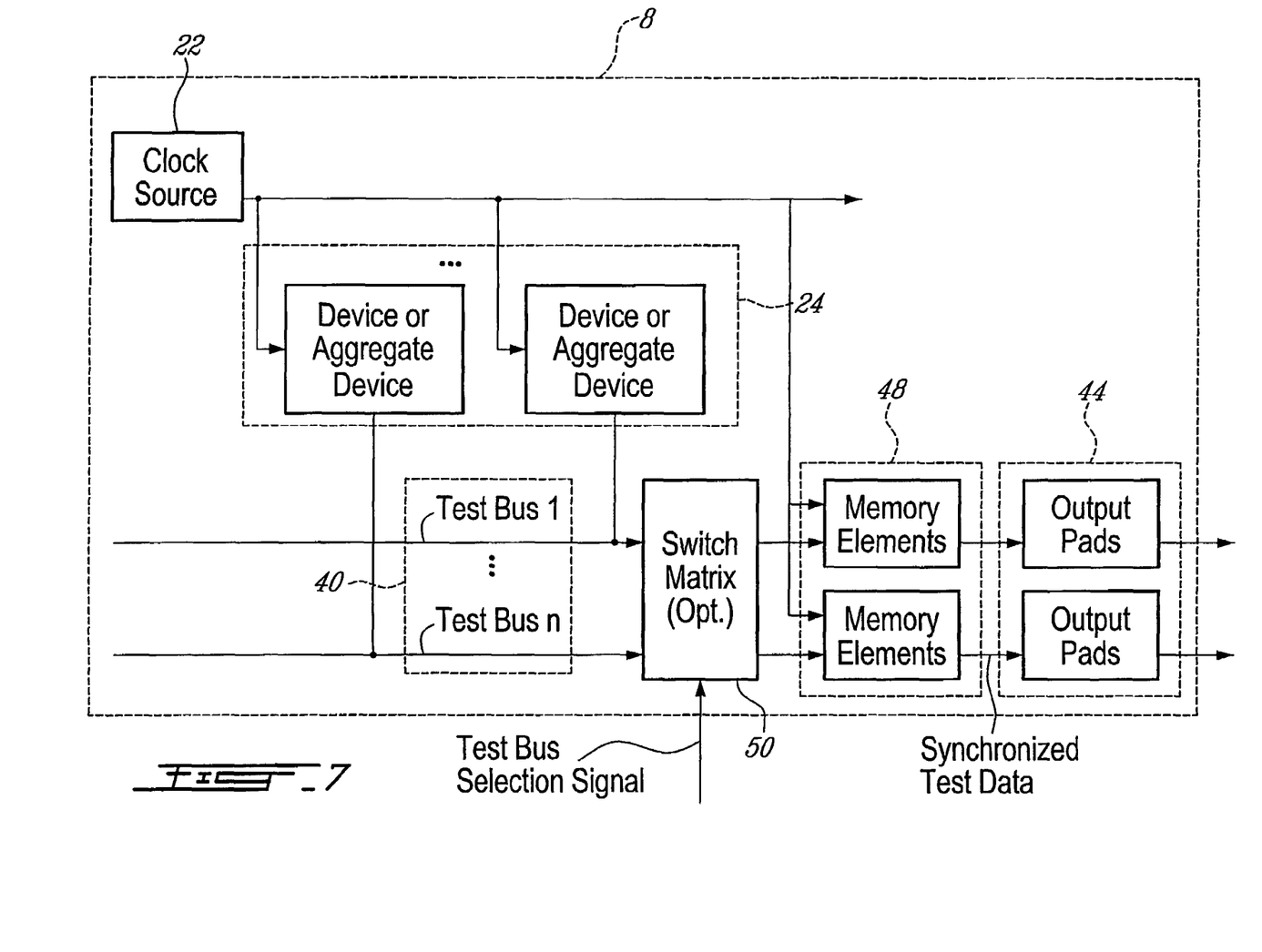
FIG. 7 is a block diagram which shows another embodiment of the invention; in this embodiment, a plurality of test buses are clocked by a single clock signal.

Now referring to FIG. 7, there is shown another alternative embodiment of the invention.

In this other alternative embodiment, a clock source 22 provides a clock source signal to a plurality of devices or aggregate devices 24 to be tested.

Each of the plurality of devices or aggregate devices provides test data to a test bus of a plurality of test buses 40. Each of the plurality of test buses 40 is connected to a memory element, of a plurality of memory elements 48, clocked by the clock source 22.

Each of the plurality of memory elements 48 therefore receives test data corresponding to a device of aggregate device of the plurality of devices or aggregate devices 24 to test.

Synchronized test data is outputted from each of the memory elements and provided to corresponding output pads of a plurality of output pads 44.

A switch matrix 50 is alternatively used to select at least one of the plurality of the test data originating from each of the plurality of test buses using a test bus selection signal.

It will also be appreciated that, in this embodiment, each device or aggregate device of the plurality of devices or aggregate devices 24 does not comprise a test bus addressing unit 14.

Figure 8:
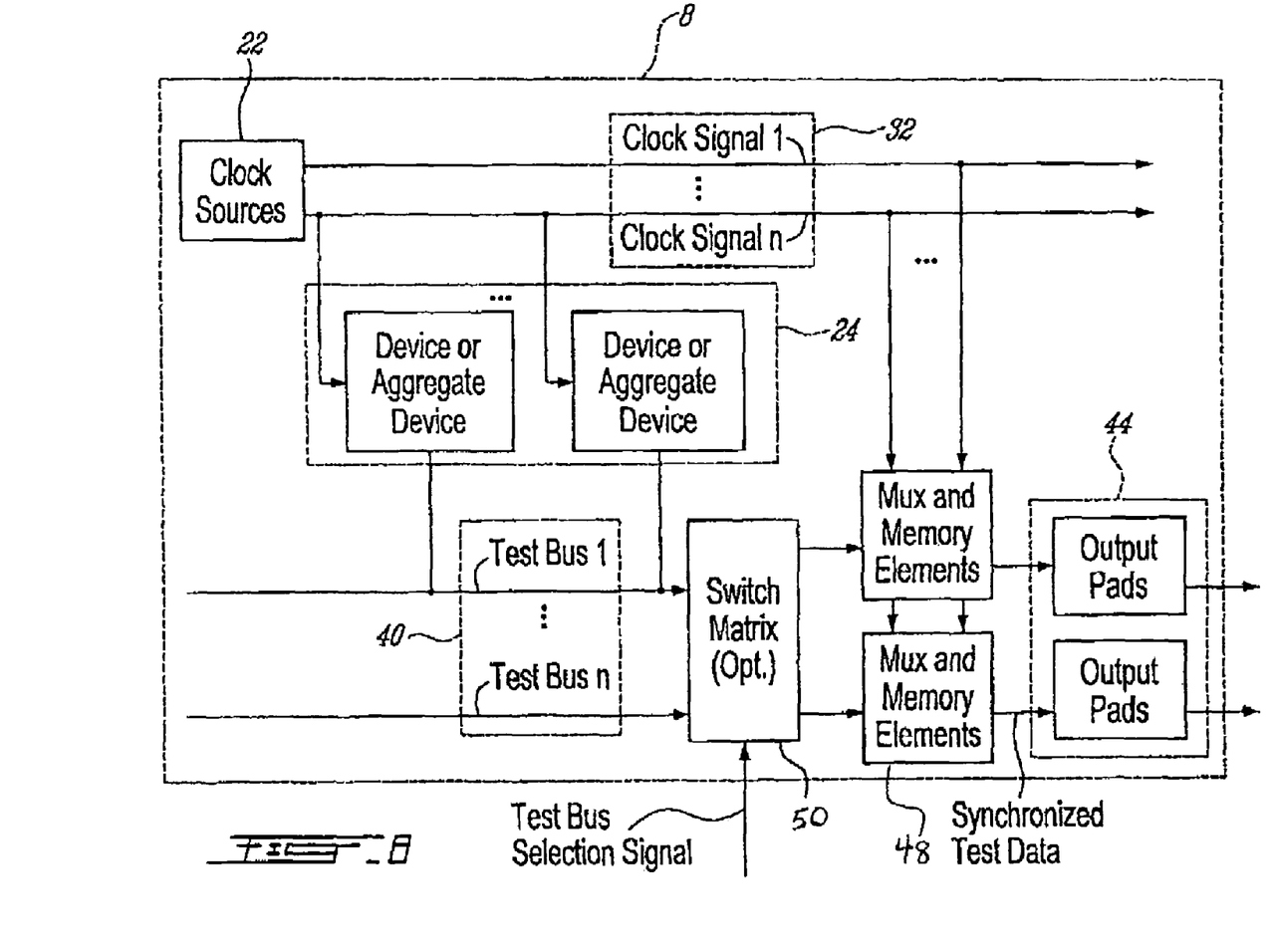
FIG. 8 is a block diagram which shows another embodiment of the invention; in this embodiment a plurality of shared test buses are clocked by a plurality of clock signals.

Now referring to FIG. 8, there is shown another alternative embodiment of the invention.

In this other alternative embodiment, a plurality of clock signals 32 are generated by a plurality of clock sources.

Each of the plurality of clock signals 32 is provided to a device or aggregate device from a plurality of devices or aggregate devices 24 to test.

Each of the device or aggregate devices provides a corresponding test data to a related test bus of a plurality of test buses 40.

A plurality of multiplexers and memory elements are used to ensure that each of the related test data are synchronized using a corresponding clock signal of the plurality of clock signals 32.

Synchronized test data is provided to corresponding output pads of a plurality of output pads 44.

Alternatively, a switching matrix 50 may be used to select at least one test bus of the plurality of test buses in accordance with a test bus selection signal.

It will be appreciated by someone skilled in the art that such selection is desirable if the number of output pads of the plurality of output pads 44 is limited.

It will be appreciated that the embodiments disclosed in FIGS. 3, 4, 5, 6, 7 and 8 may be adapted in the case of a providing of a stimulus signal instead of a collecting of a test data signal. It will further be appreciated that simultaneously a stimulus signal may be provided and a test data signal may be received.

It will further be appreciated that while in some embodiments the test bus addressing unit 14 and the test bus activation unit 16 are implemented in the device 10, in other embodiments, the test bus addressing unit 14 and the test bus activation unit 16 may be implemented outside the device 10, in the electronic component.

The embodiments of the invention described above are intended to be exemplary only. The scope of the invention is therefore intended to be limited solely by the scope of the appended claims.

We claim:

1. A method for testing a plurality of devices in an electronic component, comprising:
   selecting a plurality of test points in the devices;
   providing a data signal at each test point in accordance with a processing function of the corresponding device;
   selectively outputting the data signals from the test points on at least one test bus through at least one data signal selecting unit that does not affect timing of the data signals, whereby said at least one test bus is usable for visualizing timing information;
   whereby selectively outputting the data signals from the test points on said at least one test bus makes available for testing of the devices (a) the data signals and (b) the said timing information.

2. The method as claimed in claim 1, wherein the electronic component is selected from the group consisting of an analog circuit, a digital circuit and a mixed circuit.

3. The method as claimed in claim 1, comprising outputting the data signals from the test points on a plurality of test buses.

4. The method as claimed in claim 1, further comprising selecting between supply of a stimulus signal to a device amongst the plurality of devices and supply of a received input signal to the device.

5. The method as claimed in claim 1, further comprising providing a stimulus bus providing a stimulus signal to devices amongst the plurality of devices, each of the devices selecting between supply of the stimulus signal to said device and supply of a received input signal to the device.

6. A method as claimed in claim 1, wherein selecting a plurality of test points comprises locating the test points either inside the devices or at outputs of said devices.

7. A method as claimed in claim 1, comprising supplying a clock signal to devices amongst the plurality of devices, wherein the data signals from the test points supplied on the at least one test bus are unclocked.

8. A method as claimed in claim 1, comprising supplying a clock signal to devices amongst the plurality of devices, connecting memory elements to the at least one test bus and supplying the clock signal to the memory elements in order to resynchronize the data signals from the test points.

9. A method as claimed in claim 1, comprising supplying a different clock signal to respective devices amongst the plurality of devices, connecting memory elements to the at least one test bus, and supplying the different clock signals to the memory elements in order to resynchronize the data signals from the test points.

10. A method as claimed in claim 1, comprising outputting the data signals from the test points on a plurality of test buses, supplying a clock signal to devices amongst the plurality of devices, wherein the data signals from the test points supplied on the plurality of test buses are unclocked.

11. An apparatus for testing a plurality of devices in an electronic component, comprising:
    a plurality of test points in the devices;
    a processing function in each of the devices for producing a data signal at each test point;
    at least one test bus;
    at least one data signal selector interposed between the test points and the test bus, said at least data signal selector selectively outputting the data signals from the test points to the test bus without affecting timing of the test data signals, whereby said at least one test bus is usable for visualizing timing information;
    whereby selective outputting of the data signals on the at least one test bus makes available for testing of the devices (a) the data signals and (b) the said timing information.

12. The apparatus as claimed in claim 11, wherein the electronic component is selected from the group consisting of an analog circuit, a digital circuit and a mixed circuit.

13. The apparatus as claimed in claim 11, wherein the at least one data signal selector is responsive to a selection signal to selectively output the data signals on the at least one test bus.

14. The apparatus as claimed in claim 13, wherein the at least one test bus comprises a plurality of test buses, and wherein a plurality of said data signals are selected by the at least one data signal selector and outputted on the plurality of test buses, respectively.

15. The apparatus as claimed in claim 13, wherein the at least one data signal selector comprises a multiplexer receiving the data signals from the plurality of test points in the devices and selectively outputting the data signals to the at least one test bus in response to the selection signal.

16. The apparatus as claimed in claim 13, wherein the at least one data signal selector comprises a three-state buffer receiving one of the data signals from one of the test points and outputting the received data signal to the test bus in response to the selection signal.

17. The apparatus as claimed in claim 11, further comprising:
    a stimulus signal selector receiving a stimulus signal and an input signal and supplying one of the stimulus signal and the input signal to one of the devices in response to a selection signal.

18. The apparatus as claimed in claim 17, further comprising a plurality of stimulus signal selectors each connected to one of the devices, and further comprising a stimulus bus providing said stimulus signal to each of the plurality of stimulus signal selectors.

19. A method as claimed in claim 1, comprising outputting the data signals from the test points on a plurality of test buses, supplying a clock signal to devices amongst the plurality of devices, connecting memory elements to the plurality of test buses, and supplying the clock signal to the memory elements in order to resynchronize the data signals from the test points outputted on the plurality of test buses.

20. A method as claimed in claim 1, comprising outputting the data signals from the test points on a plurality of test buses, supplying different clock signals to respective devices amongst the plurality of devices, connecting memory elements to the plurality of test buses, and supplying the different clock signals to respective ones of the memory elements in order to resynchronize the data signals from the test points outputted on the plurality of test buses.

21. An apparatus as claimed in claim 11, wherein the test points are located either inside the devices to test or at outputs of said devices to test.

22. An apparatus as claimed in claim 11, comprising a clock source for supplying a clock signal to devices amongst the plurality of devices, wherein the data signals from the test points outputted on the at least one bus are unclocked.

23. An apparatus as claimed in claim 11, comprising a clock source for supplying a clock signal to devices amongst the plurality of devices, and memory elements connected to the at least one test bus and supplied with the clock signal in order to resynchronize the data signals from the test points.

24. An apparatus as claimed in claim 11, comprising clock sources for supplying different clock signals to respective devices amongst the plurality of devices, and memory elements connected to the at least one test bus and respectively supplied with the different clock signals in order to resynchronize the data signals from the test points.

25. An apparatus as claimed in claim 11, wherein the at least one test bus comprises a plurality of test buses to receive the data signals from the test points, said apparatus further comprising a clock source for supplying a clock signal to devices amongst the plurality of devices, wherein the data signals from the test points outputted on the plurality of test buses are unclocked.

26. An apparatus as claimed in claim 11, wherein the at least one test bus comprises a plurality of test buses to receive the data signals from the test points, said apparatus further comprising a clock source for supplying a clock signal to devices amongst the plurality of devices, and memory elements connected to the plurality of test buses and supplied with the clock signal in order to resynchronize the data signals from the test points outputted on the plurality of test buses.

27. An apparatus as claimed in claim 11, wherein the at least one test bus comprises a plurality of test buses to receive the data signals from the test points, said apparatus further comprising clock sources for supplying different clock signals to respective devices amongst the plurality of devices, and memory elements connected to the plurality of test buses and respectively supplied with the different clock signals in order to resynchronize the data signals from the test points outputted on the plurality of test buses.

* * * * *